United States Patent
Wu et al.

(10) Patent No.: US 8,011,896 B2
(45) Date of Patent: Sep. 6, 2011

(54) FAN SYSTEM

(75) Inventors: Heng-Yu Wu, Taoyuan Hsien (TW);
Chun-Lung Chiu, Taoyuan Hsien (TW);
Ming-Shi Tsai, Taoyuan Hsien (TW)

(73) Assignee: Delta Electronics Inc., Taoyuan Hsien (TW)

( * ) Notice: Subject to any disclaimer, the term of this patent is extended or adjusted under 35 U.S.C. 154(b) by 998 days.

(21) Appl. No.: 11/640,911

(22) Filed: Dec. 19, 2006

(65) Prior Publication Data

US 2007/0147986 A1 Jun. 28, 2007

(30) Foreign Application Priority Data

Dec. 23, 2005 (TW) ................................ 94145983 A
May 11, 2006 (TW) ................................ 95116700 A

(51) Int. Cl.
*F04B 41/04* (2006.01)
*F04B 35/04* (2006.01)
*F03D 9/00* (2006.01)

(52) U.S. Cl. ..................... 417/237; 417/411; 417/423.5; 290/44; 290/55

(58) Field of Classification Search .................. 417/237, 417/411, 423.5; 290/44, 55
See application file for complete search history.

(56) References Cited

U.S. PATENT DOCUMENTS

| | | | | |
|---|---|---|---|---|
| 2,246,472 A * | 6/1941 | Sharp | ............................... | 290/52 |
| 3,614,268 A * | 10/1971 | Merenda | ....................... | 417/237 |
| 4,172,692 A * | 10/1979 | Everett | ............................ | 417/45 |
| 4,911,234 A * | 3/1990 | Heberer et al. | ................ | 165/125 |
| 5,066,194 A * | 11/1991 | Amr et al. | ...................... | 415/223 |
| 5,294,195 A * | 3/1994 | Amr et al. | ...................... | 312/236 |
| 5,300,817 A * | 4/1994 | Baird | ............................... | 290/55 |
| 6,953,329 B2 * | 10/2005 | Rardin | ............................ | 417/411 |
| 7,112,905 B2 * | 9/2006 | Chang et al. | .................. | 310/112 |
| 7,208,846 B2 * | 4/2007 | Liang | ........................... | 290/1 R |
| 7,347,673 B2 * | 3/2008 | Yamanouchi et al. | ........ | 417/237 |
| 2005/0074324 A1* | 4/2005 | Yoo | ................................ | 415/4.3 |
| 2006/0104836 A1* | 5/2006 | Phillips | ........................ | 417/411 |

* cited by examiner

*Primary Examiner* — Charles G Freay
(74) *Attorney, Agent, or Firm* — Birch, Stewart, Kolasch & Birch, LLP

(57) ABSTRACT

A fan system is electrically connected with a driving source generator and includes a first fan, a second fan and an energy storage element. The second fan is rotated by the first fan for generating an electric energy. The energy storage element is electrically connected with the second fan for storing the electric energy and keep supplying power when the driving source generator is out of order or the fan is rotating in lower rotation speed.

21 Claims, 5 Drawing Sheets

FAN SYSTEM

BACKGROUND OF THE INVENTION

1. Field of Invention

The present invention relates to a fan system, and more particularly to a fan system capable of storing energy by itself for re-usage.

2. Related Art

Accompanying to the development of technology, the functionality of electronic system is upgraded and the integration of electronic devices is also raised. Electronic system is generally disposed at least one fan for heat dissipation to keep electronic system being normally operated.

In order to enhance the effect of heat dissipation, a plurality of fans are connected with each other in series to raise the pressure and volume of airflow. As shown in FIG. 1, a conventional fan system 1 includes a first fan 11 and a second fan 12. An external voltage source P is connected with the first fan 11 and the second fan 12 when the first fan 11 and the second fan 12 are connected in series. However, the second fan 12 is rotated by the first fan 11 and needs not to be driven by the voltage source P when the first fan 11 is driven to rotate by the voltage source P. In addition, the second fan 12 is driven by the voltage source P when the first fan 11 is out of order. The first fan 11 is thus driven to rotate by the second fan 12. Under such construction, the first fan 11 or the second fan 12 is driven by the other fan, and the energy generated by the driven fan is wasted and not recycled for re-usage. The heat dissipation of the electronic system will be affected if the voltage source P is out of order.

It is thus imperative to provide a fan system capable of storing energy by itself for re-usage.

SUMMARY OF THE INVENTION

In view of the foregoing, the present invention provides a fan system capable of storing energy by itself for re-usage and achieving the effect of power saving.

To achieve the above, a fan system according to the present invention is electrically connected with a driving source generator. The fan system includes a first fan, a second fan and an energy storage element. The first fan is driven to rotate by the driving source generator, and the second fan is rotated by the first fan for generating an electric energy. The energy storage element is electrically connected with the second fan for storing the electric energy therein.

To achieve the above, another fan system according to the present invention is electrically connected with a driving source generator. The fan system includes a fan and an energy storage element. The fan has a first impeller and a second impeller, the first impeller is driven to rotate by the driving source generator, wherein the second impeller is rotated by the first impeller to generate an electric energy. The energy storage element is electrically connected with the second impeller to store the electric energy therein.

To achieve the above, yet another fan system according to the present invention is electrically connected with a driving source generator. The fan system includes a first fan, a plurality of second fans and an energy storage element. The first fan is driven to rotate by the driving source generator, and the second fans are rotated by the first fan for generating an electric energy. The energy storage element is electrically connected with the second fans for storing the electric energy therein.

As mentioned above, a fan system according to the present invention utilizes a first fan driving at least one second fan to rotate, an electric energy generated by the second fan is recycled and stored in an energy storage element. The energy storage element keeps supplying power when the driving source generator is out of order or the fan is rotating in lower rotation speed. That is, the energy storage element can be used as an emergency driving source generator to keep heat dissipation when the driving source generator is out of order or the fan is rotating at lower rotation speed. Compared with the prior art, the present invention can store energy by itself for re-usage so that the energy is thus completely used. The effects of power saving, reducing power consumption and green product are achieved.

BRIEF DESCRIPTION OF THE DRAWINGS

The present invention will become more fully understood from the detailed description given herein below illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
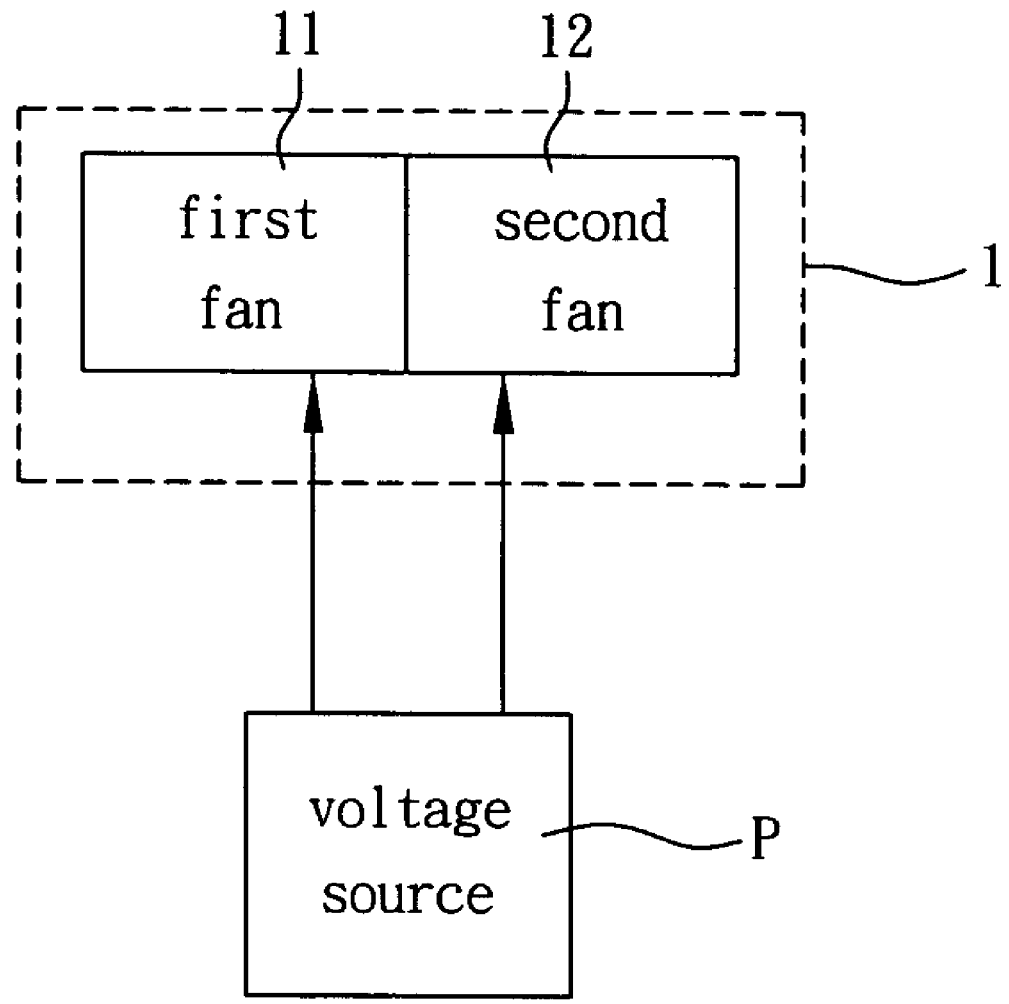
FIG. 1 is a schematic diagram showing a conventional fan system.
Figure 2:
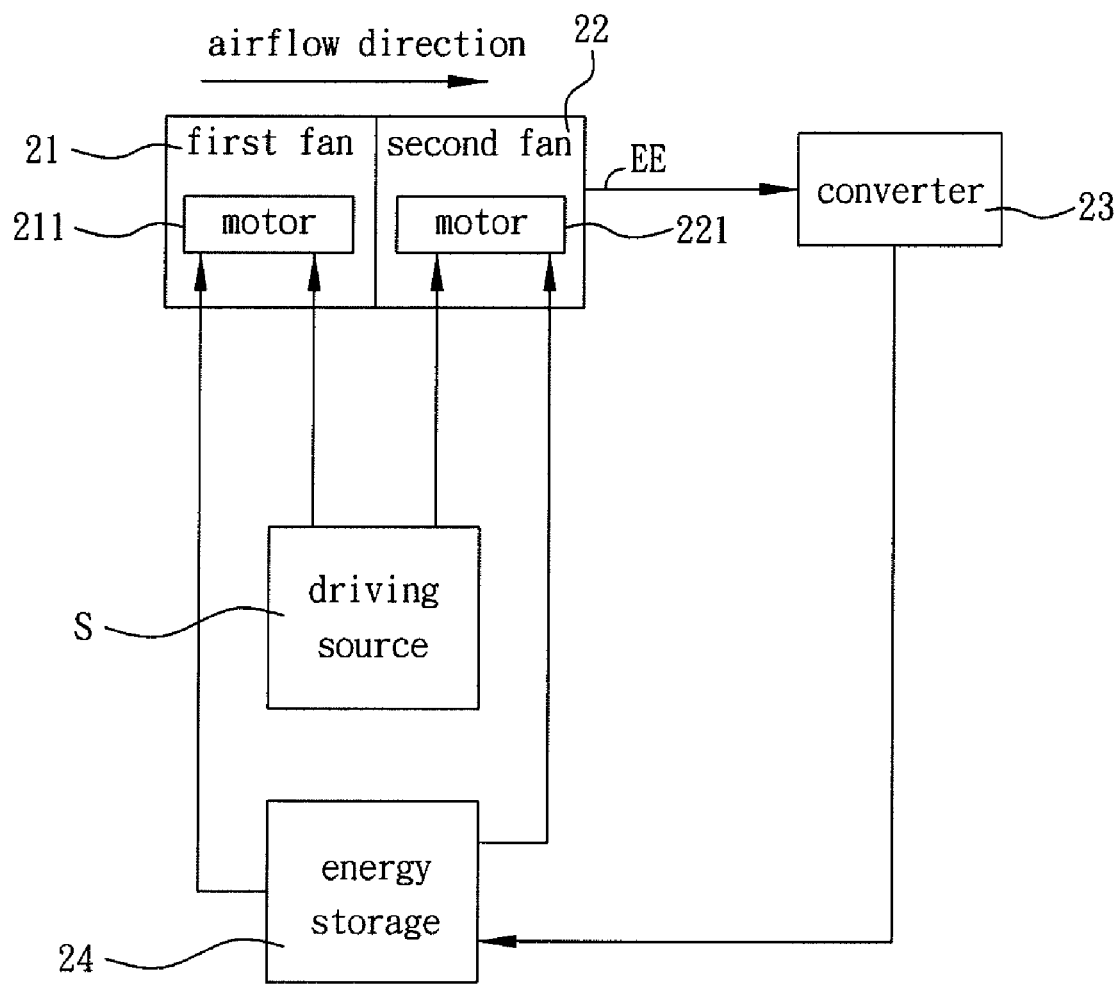
FIG. 2 is a schematic diagram showing a fan system according to a first embodiment of the present invention.

As shown in FIG. 2, a fan system 2 according to a first embodiment of the present invention includes a motor 211 of a first fan 21, a motor 221 of a second fan 22 and an energy storage element 24. The fan system 2 is electrically connected with a driving source generator S. The first fan 21 and the second fan 22 are disposed in series (according to the airflow direction). The driving source generator S is electrically connected with the first fan 21 and the second fan 22. The energy storage element 24 is electrically connected with the second fan 22. In addition, the energy storage element 24 can be further connected with the first fan 21. In this embodiment, the driving source generator S can be a generator or a power supply. The first fan 21 and/or the second fan 22 can be an axial fan. The energy storage element 24 can be a battery or a chargeable battery.

The fan system 2 is operated as described below. The motor 221 of the second fan 22 is rotated by the first fan 21 when the motor 211 of the first fan 21 is driven by the driving source generator S. The coils of motor 221 of the second fan 22 induce an electric energy EE through the rotation according to Faraday's law.

The fan system 2 further includes a converter 23 electrically connected with the second fan 22 and the energy storage element 24 to convert the electric energy EE generated by the second fan 22, and store the electric energy EE in the energy storage element 24.

The motor 221 of the second fan 22 can be driven by the driving source generator S to keep heat dissipation when the first fan 21 is out of order. In addition, the stored electric energy EE in the energy storage element 24 can drive the motor 211 of the first fan 21 and/or the motor 221 of the second fan 22 when the driving source generator S is out of order. Under such construction, the present invention can maintain heat dissipation and store energy for re-usage. The energy is thus completely used, and the effects of power saving and reducing power consumption are achieved.

Figure 3:
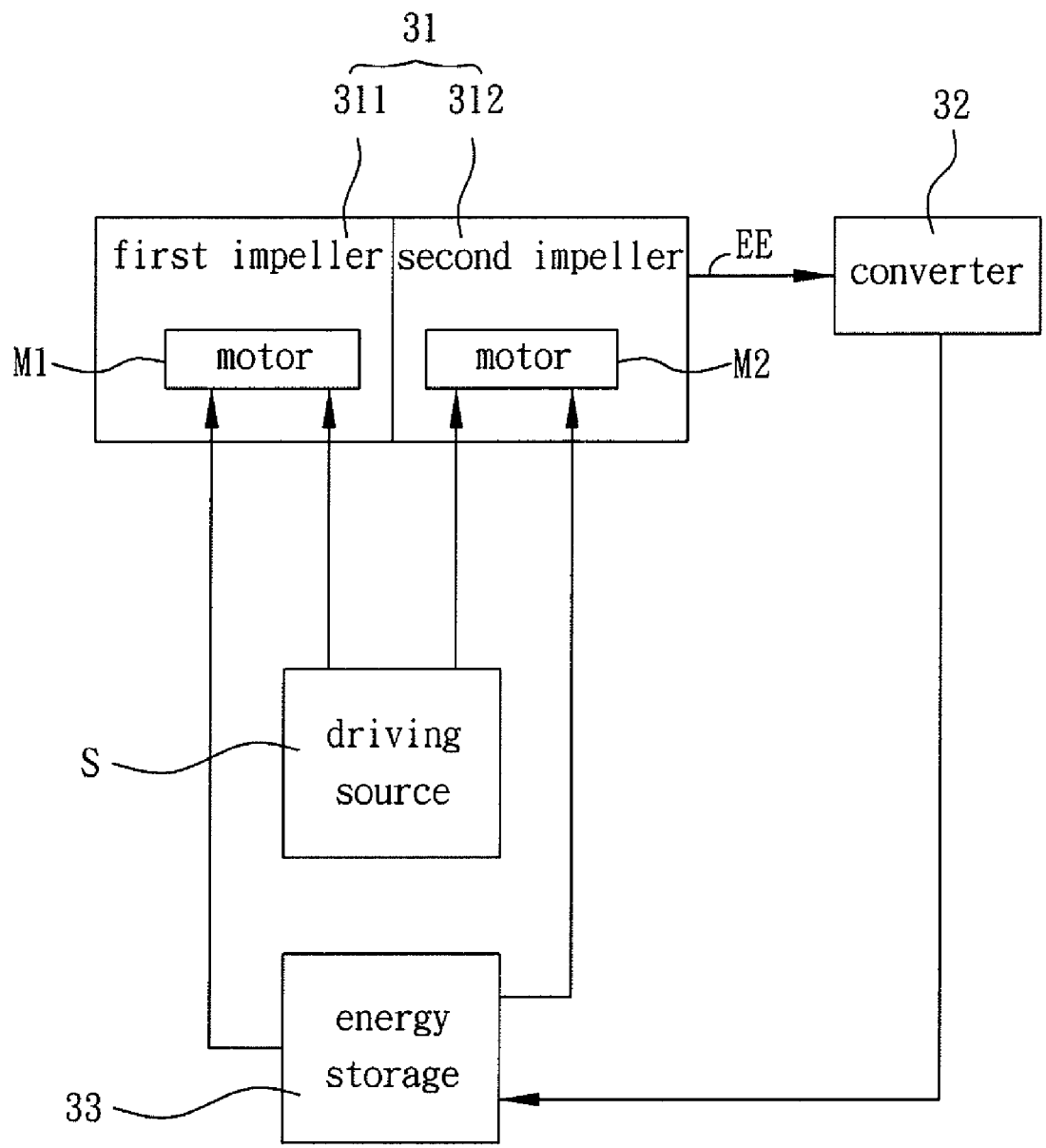
FIG. 3 is a schematic diagram showing a fan system according to a second embodiment of the present invention.

As shown in FIG. 3, a fan system 3 according to a second embodiment of the present invention is electrically connected with a driving source generator S. The fan system 3 includes a fan 31 and an energy storage element 33. The fan 31 has a first impeller 311 and a second impeller 312. The first impeller 311 and the second impeller 312 are coupled in series and are accommodated in a frame (not shown). The driving source generator S is electrically connected with the motor M1 of the first impeller 311 and the motor M2 of the second impeller 312.

The fan system 3 further includes a converter 32 electrically connected with the second impeller 312 and the energy storage element 33. The energy storage element 33 is electrically connected with the second impeller 312, and can be further connected with the first impeller 311. In this embodiment, the driving source generator S can be a generator or a power supply. The fan 31 can be an axial fan. The energy storage element 33 is preferably a battery or a chargeable battery.

The fan system 3 is operated as described below. The motor M2 of the second impeller 312 is rotated by the first impeller 311 when the motor M1 of the first impeller 311 is driven by the driving source generator S. The coils of motor of the second impeller 312 induce an electric energy EE through the rotation. The second impeller 312 is thus an impeller generating electric energy. At this time, the converter 32 converts the electric energy EE generated by the second impeller 312, and stores the electric energy EE in the energy storage element 33.

The motor M2 of the second impeller 312 can be driven by the driving source generator S to keep heat dissipation when the first impeller 311 is out of order. In addition, the stored electric energy EE in the energy storage element 33 can drive the motor M1 of the first impeller 311 and/or the motor M2 of the second impeller 312 to rotate when the driving source generator S is out of order. Under such construction, the present invention can maintain heat dissipation and store energy for re-usage. The energy is thus completely used, and the effects of power saving and reducing power consumption are achieved.

Figure 4:
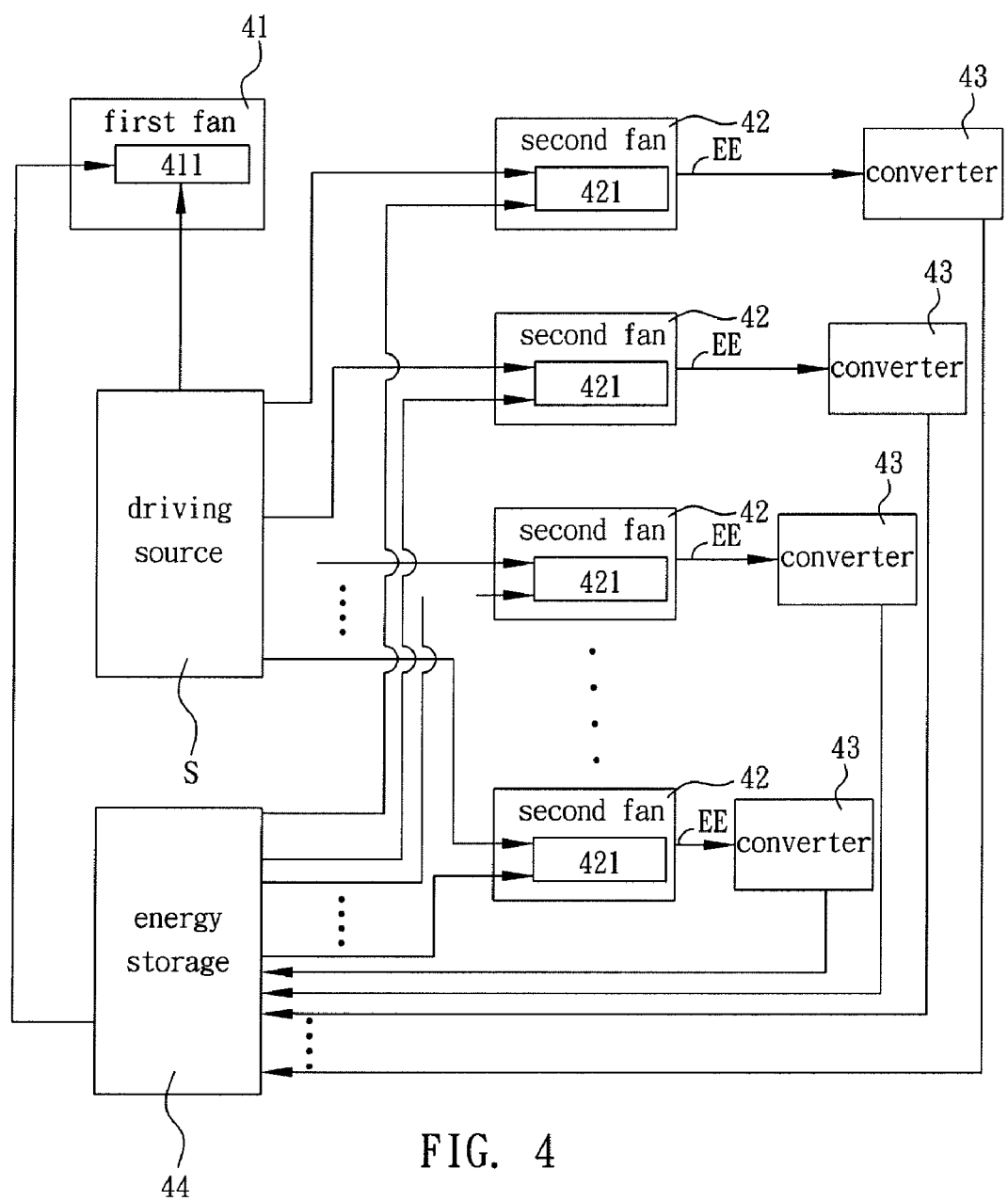
FIG. 4 is a schematic diagram showing a fan system according to a third embodiment of the present invention.

As shown in FIG. 4, a fan system 4 according to a third embodiment of the present invention is electrically connected with a driving source generator S. The fan system 4 includes a first fan 41, a plurality of second fans 42 and an energy storage element 44. The fan system 4 further includes a plurality of converters 43. The converters 43 can be replaced with a single converter electrically connected with the second fans 42. The driving source generator S is electrically connected with the motor 411 of the first fan 41 and the motor 421 of the second fan 42.

In this embodiment, the constructions and functions of the first fan 41, the second fans 42, the converters 43 and the energy storage element 44 are the same as those described in the first embodiment, so the detailed descriptions thereof is omitted. In addition, the first or second fan can be a high-pressure fan or an axial-flow fan.

The difference between this embodiment and the first embodiment is that the first fan 41 is respectively connected with the second fans 42 in series, and the second fans 42 are connected with each other in parallel. The converters 43 are connected with the second fans 42, respectively. The energy storage element 44 is electrically connected with the converters 43 and the second fans 42, and can be further connected with the first fan 41. The motor 421 of the second fans 42 are rotated by the first fan 41 when the motor 411 of the first fan 41 is driven by the driving source generator S. The coils of motor 421 of the second fans 42 induce an electric energy EE through the rotation. Each of the converters 43 converts the electric energy EE generated by the corresponding second fan 42, and stores the electric energy EE in the energy storage element 44.

The driving source generator S can drive the motor 411 of the first fan 41 or a part of the motor 421 of the second fans 42 to rotate. The stored electric energy EE in the energy storage element 44 can drive the motor 411 of the first fan 41 or a part of the motor 421 of the second fans 42 to rotate when the driving source generator S is out of order. Under such construction, the present invention can keep heat dissipation and store energy for re-usage. The energy is thus completely used, and the effects of power saving and reducing power consumption are achieved.

Figure 5:
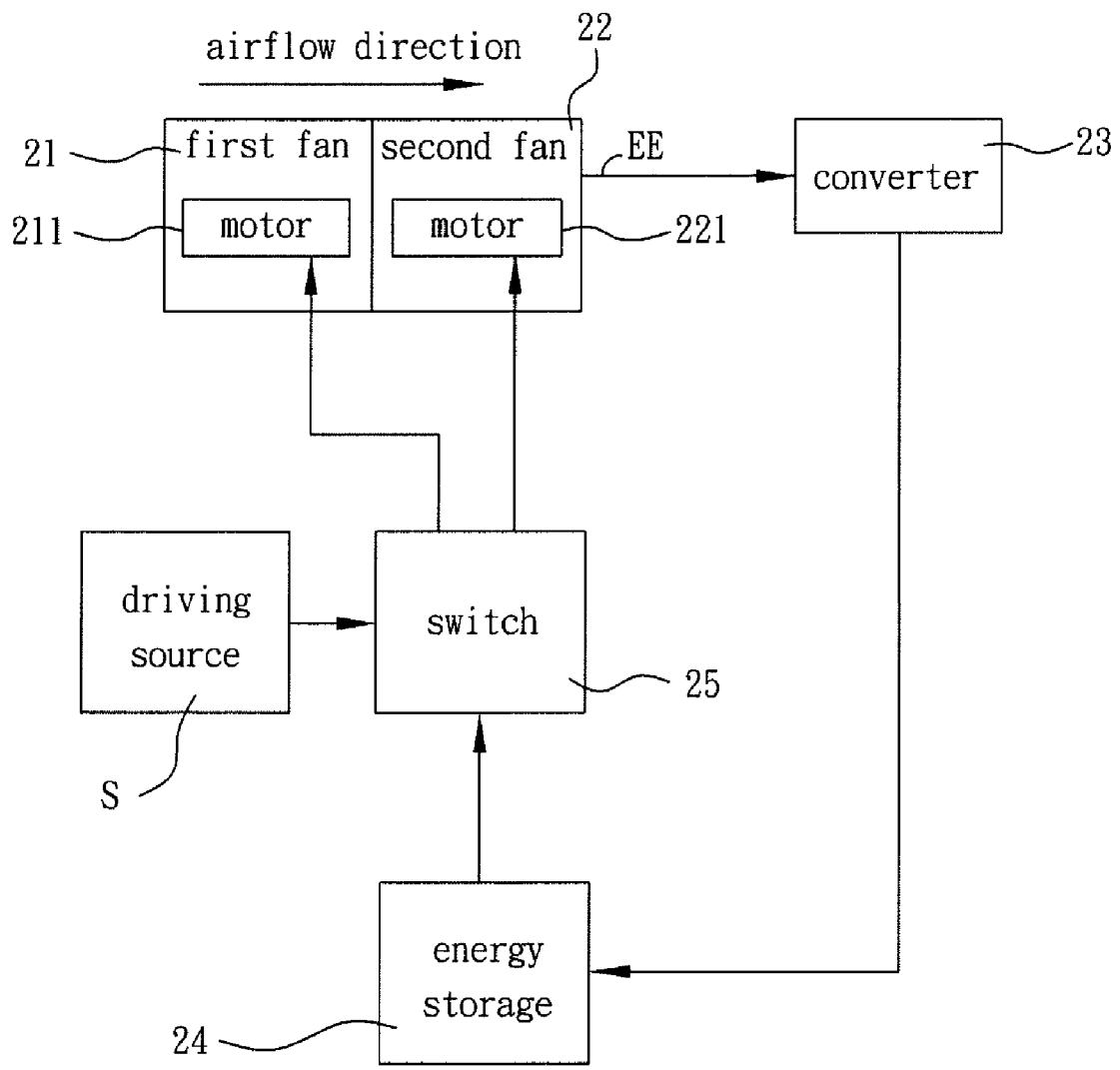
FIG. 5 is a schematic diagram showing a fan system according to a fourth embodiment of the present invention.

As shown in FIG. 5, a fan system 2 according to a fourth embodiment of the present invention is electrically connected with a driving source generator S. The fan system 2 includes a first fan 21, a second fan 22 and an energy storage element 24. In addition, the fan system 2 further includes a converter 23 and a switch 25.

In this embodiment, the constructions and functions of the first fan 21, the second fans 22, the converters 23 and the energy storage element 24 are the same as those of the fan system 2 in the first embodiment, so the detailed descriptions thereof are omitted.

The difference between this embodiment and the first embodiment is that the fan system 2 further includes the switch 25 electrically connected between the driving source generator S and the energy storage element 24. The switch 25 is used to switch the driving source generator S or the energy storage element 24 for driving the motor 211 of the first fan 21 and/or the motor 221 of the second fan 22 to rotate. For example, the motor 221 of the first fan 21 is driven to rotate by the electric energy outputted from the driving source generator S when starting the first fan 21. When the environmental temperature of the fan system 2 is lower than a target value, that is, the rotation speed of the first fan 21 can be reduced, the first fan 21 is kept driving to rotate by the energy storage element 24 through the switch action of the switch 25. The effect of energy effective usage is thus achieved.

In addition, the switch 25 can be applied to the previous embodiments. The constructions and functions of the switch 25 are substantially identical, so the detailed descriptions thereof are omitted.

In summary, a fan system according to the present invention utilizes a first fan driving at least one second fan to rotate, an electric energy generated by the second fan is recycled and stored in an energy storage element. The energy storage element keeps supplying power when the driving source generator is out of order or the fan is rotating at lower rotation speed. That is, the energy storage element can be used as an emergency driving source generator to keep heat dissipation when the driving source generator is out of order or the fan is rotating at lower rotation speed. Compared with the prior art, the present invention can store energy by itself for re-usage so that the energy is thus completely used. The effects of power saving, reducing power consumption and green product are achieved.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A fan system, comprising:
   a first fan having a motor which is electrically connected with a driving source generator, wherein the motor of the first fan is driven by the driving source generator;
   a second fan having a motor which is induced for generating an electric energy by the first fan; and
   an energy storage element having an input terminal and two output terminals, wherein the input terminal is electrically connected with the second fan for storing the electric energy therein, and the output terminals are electrically connected with the first fan and the second fan, respectively.

2. The fan system according to claim 1, wherein the electric energy is used for driving the second fan to rotate.

3. The fan system according to claim 1, wherein the energy storage element provides the electric energy to the first fan and/or the second fan for driving the motor of the first fan and/or the motor of the second fan.

4. The fan system according to claim 1, wherein the driving source generator is electrically connected with the first fan and/or the second fan for driving the motor of the first fan and/or the motor of the second fan to rotate.

5. The fan system according to claim 1, wherein the first fan and the second fan are connected in series.

6. The fan system according to claim 1, wherein the energy storage element is a battery or a chargeable battery.

7. The fan system according to claim 1, wherein the driving source generator is a generator or a power supply.

8. The fan system according to claim 1 further comprising a converter electrically connected with the second fan and the energy storage element to convert the electric energy generated by the second fan, and store the electric energy in the energy storage element.

9. The fan system according to claim 1 further comprising a switch electrically connected between the energy storage element and the driving source generator so as to switch the energy storage element or the driving source generator for driving the motor of the first fan and/or the motor of the second fan to rotate.

10. The fan system according to claim 1 further comprising a plurality of second fans.

11. The fan system according to claim 10, wherein the second fans are connected with each other in parallel.

12. The fan system according to claim 1, wherein the first or second fan is a high-pressure fan or an axial-flow fan.

13. A fan system, comprising:
    a fan having a first impeller and a second impeller, wherein the first impeller has a motor which is electrically connected with a driving source generator, and the motor of the first impeller is driven by the driving source generator, the second impeller has a motor which is rotated by the first impeller to generate an electric energy; and
    an energy storage element having an input terminal and two output terminals, wherein the input terminal is electrically connected with the second impeller to store the electric energy therein, and the output terminals are electrically connected with the first impeller and the second impeller, respectively.

14. The fan system according to claim 13, wherein the first impeller and the second impeller are accommodated in a frame.

15. The fan system according to claim 13, wherein the electric energy is used for driving the second impeller to rotate.

16. The fan system according to claim 13, wherein the energy storage element provides the electric energy to the first impeller and/or the second impeller for driving the motor of the first impeller and/or the motor of the second impeller.

17. The fan system according to claim 13, wherein the driving source generator is electrically connected with the first impeller and/or the second impeller, for driving the motor of the first impeller and/or the motor of the second impeller to rotate.

18. The fan system according to claim 13, wherein the first impeller and the second impeller are connected in series.

19. The fan system according to claim 13 further comprising a converter electrically connected with the second impeller and the energy storage element to convert the electric energy generated by the second impeller, and store the electric energy in the energy storage element.

20. The fan system according to claim 13 further comprising a switch electrically connected between the energy storage element and the driving source generator so as to switch the energy storage element or the driving source for driving the first impeller and/or the second impeller to rotate.

21. A fan system, comprising:
    a first fan having a motor which is electrically connected with a driving source generator, wherein the motor of the first fan is driven by the driving source generator;
    a second fan having a motor which is induced for generating an electric energy by the first fan; and
    an energy storage element having an input terminal and two output terminals, wherein the input terminal is electrically connected with the second fan for storing the electric energy therein, and the output terminals are electrically connected with the first fan and the second fan, respectively,
    wherein the energy storage element is used for driving the motor of the first fan and/or the motor of the second fan to rotate while the driving source generator is out of order.

* * * * *